United States Patent [19]
Robbins et al.

[11] Patent Number: 6,067,633
[45] Date of Patent: May 23, 2000

[54] DESIGN AND METHODOLOGY FOR MANUFACTURING DATA PROCESSING SYSTEMS HAVING MULTIPLE PROCESSORS

[75] Inventors: Gordon J. Robbins; David Ray Bearden, both of Austin, Tex.

[73] Assignees: International Business Machines Corp, Armonk, N.Y.; Motorola, Inc., Schaumburg, Ill.

[21] Appl. No.: 09/052,248

[22] Filed: Mar. 31, 1998

[51] Int. Cl.[7] .................................................. G06F 11/22
[52] U.S. Cl. ............................ 714/1; 712/28; 712/236; 714/2; 714/8; 714/10; 714/11; 714/13; 714/25; 714/31; 714/40; 714/41; 714/710
[58] Field of Search .............................. 712/28, 236, 29; 714/1–41, 710, 733; 708/230

[56] References Cited

U.S. PATENT DOCUMENTS

| | | | |
|---|---|---|---|
| 3,681,578 | 8/1972 | Stevens | 714/11 |
| 4,314,349 | 2/1982 | Batcher | 708/230 |
| 4,365,318 | 12/1982 | Aichelmann, Jr. et al. | 365/200 |
| 4,523,313 | 6/1985 | Nibby, Jr. et al. | 714/710 |
| 4,587,481 | 5/1986 | Lischke et al. | 324/72.5 |
| 4,698,807 | 10/1987 | Marwood et al. | 714/11 |
| 4,802,119 | 1/1989 | Heene et al. | 714/7 |
| 4,802,164 | 1/1989 | Fukuoka et al. | 714/44 |
| 4,823,256 | 4/1989 | Bishop et al. | 714/10 |
| 4,891,810 | 1/1990 | de Corlieu et al. | 714/11 |
| 4,958,273 | 9/1990 | Anderson et al. | 712/29 |
| 5,042,008 | 8/1991 | Iwasa et al. | 365/185.05 |
| 5,045,995 | 9/1991 | Levinthal | 712/236 |
| 5,051,994 | 9/1991 | Bluethman et al. | 714/8 |
| 5,136,498 | 8/1992 | McLaughlin et al. | 364/184 |
| 5,423,024 | 6/1995 | Cheung | 714/11 |
| 5,440,724 | 8/1995 | Boothroyd et al. | 714/733 |
| 5,504,670 | 4/1996 | Barth et al. | 364/134 |
| 5,596,759 | 1/1997 | Miller et al. | 713/323 |

*Primary Examiner*—Meng-Ai T. An
*Assistant Examiner*—Nabil El-Hady
*Attorney, Agent, or Firm*—Winstead Sechrest & Minick P.C.; Anthony V. S. England

[57] ABSTRACT

A multi-processor system and methodology optimize overhead costs associated with manufacturing large integrated circuit devices having multiple data processors and processing elements thereon by effectively disabling processing elements that are not functional. Disabling the processing elements is performed through segmented power distribution on an integrated circuit first-level package or by providing inhibit signals in pre-selected logic states based on the functionality of the multi-processing system. The functionality of the multiprocessing system is determined during an initial testing procedure, including wafer-level testing.

21 Claims, 4 Drawing Sheets

DESIGN AND METHODOLOGY FOR MANUFACTURING DATA PROCESSING SYSTEMS HAVING MULTIPLE PROCESSORS

TECHNICAL FIELD

The present invention relates in general to a method for manufacturing microprocessors, and in particular, to a design and methodology for manufacturing data processing systems having multiple processing unit.

BACKGROUND INFORMATION

As technology has progressed, the demands made of data processing systems have steadily increased to require faster and more efficient performance. In order to achieve the desired performance requirements, multiple processors are often used to perform functions in parallel to increase the overall processing capability of a data processing system. Such multi-processor systems typically implement multiple silicon chips that are interconnected to perform a desired function.

With multiple processors being collectively used to provide a single function, it is important to compensate for failures within one of the processors in a manner that is easily implemented and reduces an amount of overhead or cost associated with implementing the multi-processor system. Current implementations of multi-processor systems typically comprise multiple processors, wherein at least a portion of the multiple processors are provided as redundant processors to ensure that the multi-processing module functions correctly at all times. For example, U.S. Pat. No. 4,891,810 by Patrick de Corlieu, et al. discloses a computer comprising redundant elements, wherein one of the redundant elements takes the place of a malfunctioning element to ensure that a critical stage processing does not result in erroneous results. Similarly, U.S. Pat. No. 4,823,256 by Bishop, et al. discloses a dual processor system which has two modes of operation: a converged mode and a diverged mode. In the diverged mode of operation, both processors are active and execute different tasks. When in this mode, the dual processor system enables one of the two processors to have to be a primary processor. In the converged mode of operation, the dual processor system of U.S. Pat. No. 4,823,256 enables one processor to be active, while the other processor is standing by to take up execution of the tasks from a point where the first processor terminated execution. In yet another example, U.S. Pat. No. 3,681,578 by Stevens which discloses a data processing system having three data processors for processing the same information. When an output of the data processor substantially disagrees with an output of a majority of the other processors an alarm is raised or the particular processor may be isolated. Additional examples of processor systems that utilize duplicate processors or circuitry to correct errors may be found in U.S. Pat. No. 4,802,119 by Heene, et al. and in U.S. Pat. No. 5,136,498 by McLaughlin, et al.

While each of the aforementioned multi-processor systems provides a unique method for ensuring that a multi-processor system functions correctly, the use of multiple processors to perform this function results in excessive overhead requirements. Additionally, each of the aforementioned patents fails to address the situation in which a redundant data processor is faulty or is not required for performing a specific data processing application. In each of these cases, the data processing systems disclosed in the cited patents require the overhead associated with each of the redundant data processing systems to be utilized.

SUMMARY OF THE INVENTION

The previously mentioned needs are fulfilled with the present invention. Accordingly, there is provided, in a first form, a first-level integrated circuit package. The first-level integrated circuit includes a first processing element and a second processing element. The first processing element is capable of performing a first data processing function and the second processing element is capable of performing a second data processing function. The first data processing function and the second data processing function are performed in parallel. The first-level integrated circuit also includes a first plurality of embedded control lines for selectively inhibiting the first processing element from performing the first data processing function. As well, the first-level integrated circuit includes a second plurality of embedded control lines for selectively inhibiting the second processing element from performing the second data processing function.

Furthermore, there is provided, in a second form, a method for manufacturing a data processing system including a plurality of processing elements implemented on a single integrated circuit and a first-level integrated circuit package. The method includes the step of testing a first processing element and the second processing element of the data processing system to identify when at least one of the first processing element and the second processing element fail to function according to a specification. The method also includes the step of selectively inhibiting operation of the first processing element using a first embedded control line when the first processing element fails to function according to the specification. The method includes the step of selectively inhibiting operation of the second processing element using a second embedded control line when the second processing element fails to function according to the specification. Additionally, the method also includes the step of selectively enabling operation of the first processing element and the second processing element when the first processing element and the second processing element function according to the specification. The first processing element and the second processing element execute data processing applications in parallel.

Additionally, there is provided, in a third form, a data processing system. The data processing system includes an integrated circuit. The integrated circuit includes a first processing element and a second processing element. The first processing element is capable of performing a first data processing function and the second processing element is capable of performing a second data processing function. The first data processing function and the second data processing function are performed in parallel. The data processing system also includes an integrated circuit package. The integrated circuit package includes a first plurality of embedded control lines for selectively inhibiting the first processing element from performing the first data processing function and a second plurality of embedded control lines for selectively inhibiting the second processing element from performing the second data processing function.

These and other features, and advantages, will be more clearly understood from the following detailed description taken in conjunction with the accompanying drawings. It is important to note the drawings are not intended to represent the only form of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the present invention, multiple data processors are implemented on a single silicon chip. As multiple data processors are implemented on a single silicon device (a "multi-processing" system), the resulting integrated circuit is substantially larger in area than most single core designs that implement only a single processor. With such increased integrated circuit size, the yield associated with manufacturing such multi-processing systems is often noticeably lower than devices having only a single processor because defects are more likely to occur when a larger silicon area is evaluated. Therefore, multi-processing systems in which all processors are functional have a relatively low likelihood of occurrence. Stated another way, it is much more common for only a portion of the processors implemented on a multi-processing system to be functional. Thus, given the large area requirements of the multi-processing system to the present invention, it is likely that a large number of manufactured multi-processing systems will have at least one faulty processor and will, therefore, not provide a fully functional device. However, it is expensive and will result in substantial "scrap" costs to fail to use the multi-processing system device when only a portion of the processors implemented therein failed to work properly.

To address these issues, to minimize scrap costs, and to maximize yield, the present invention implements the concept of "partially good" integrated circuits. An example of a "partially good" integrated circuit includes an integrated circuit in which four processor cores have been implemented in the multi-processor design, but only three of the processor cores function according to the specifications of the manufacturer and designer. In this case, a multiprocessing system having only three processor cores, rather than the fill four processor cores may be sold for applications requesting less performance. Similarly, a multi-processing system having only two core processors could also be sold to applicable markets to aid in recovering the overhead costs associated with such functionality.

In the present invention, a data processing system and methodology ensures that a multi-processing system may be implemented with either full or partial functionality to insure the most efficient use or yield of manufacturer's integrated circuits. In the present invention, embedded control lines are implemented in an integrated circuit first-level package, or substrate, to isolate non-functional areas of the multi-processing device. It should be noted that the integrated circuit first-level package may be implemented as a ball grid array in one embodiment of the present invention. Thus, by using this configuration, should one processor within the multi-processing device not be functional, the embedded control lines may be used to isolate a faulty area so that it appears to an external user that the failing device is not implemented on the data processing system. In an alternate embodiment of the present invention, segmented power distribution may also be used to isolate the non-functional areas of the silicon device. By using such configurations, integrated circuit first-level packages that support different levels of functionality for the multi-processor system may be developed to support each of the possible configurations of a multi-processing device.

An implementation of the present invention will subsequently be described in greater detail. In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art. Furthermore, during a description of the implementation of the invention, the terms "assert" and "negate" and various grammatical forms thereof, are used to avoid confusion when dealing with the mixture of "active high" and "active low" logic signals. "Assert" is used to refer to the rendering of a logic signal or register bit into its active, or logically true, state. "Negate" is used to refer to the rendering of a logic signal or register bit into its inactive, or logically false, state.

Refer now to the drawings wherein depicted elements are not necessarily shown to scale and wherein like or similar elements are designated by the same reference numeral through the several views.

Figure 1:
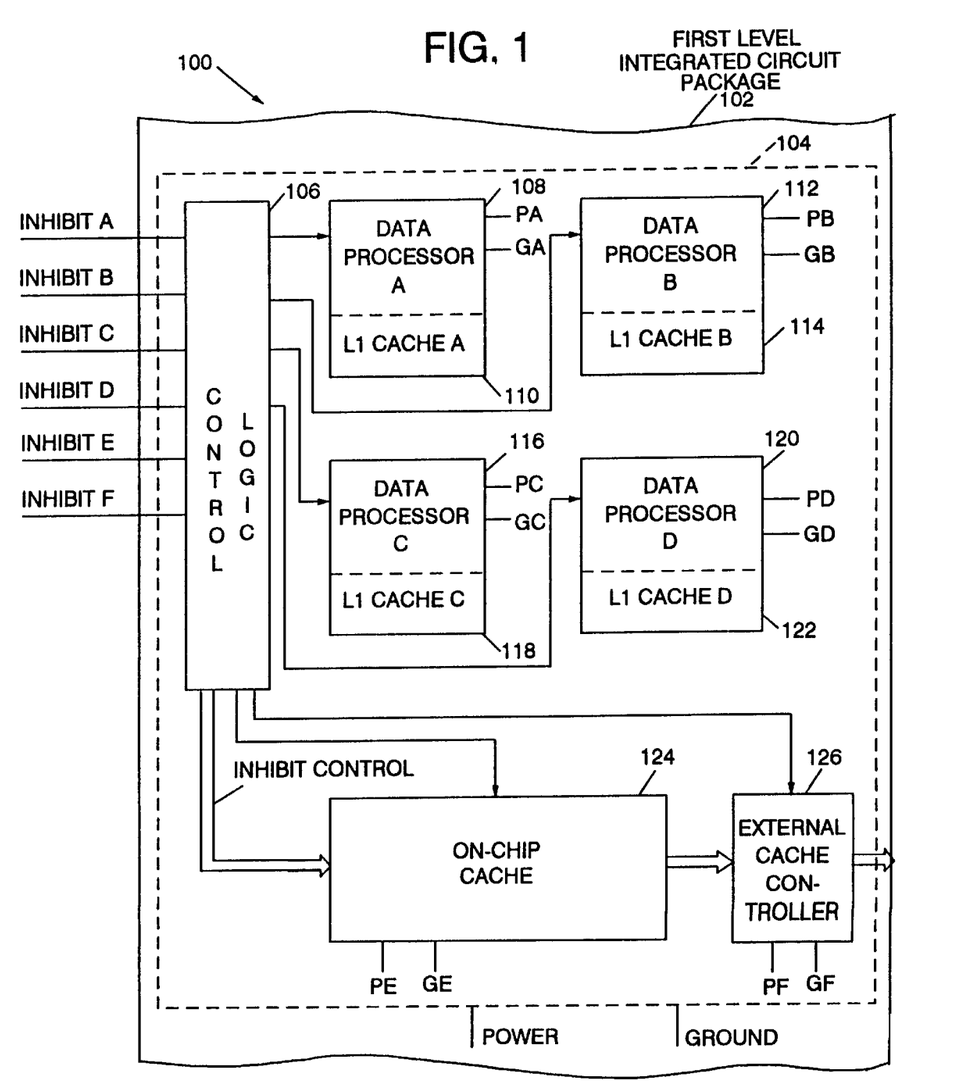
FIG. 1 illustrates, in block diagram form, a multi-processor system implemented on a single silicon chip in accordance with one embodiment of the present invention.

FIG. 1 illustrates a data processing system 100 in accordance with one embodiment of the present invention. Data processing system 100 comprises an integrated circuit first-level package 102 and a multi-processing system 104. Multi-processing system 104 comprises a control logic circuit 106, a data processor A 108, an L1 cache A 110, a data processor B 112, an L1 cache B 114, a data processor C 116, an L1 cache C 118, a data processor D 120, an L1 cache D 122, on-chip cache 124, and an external cache controller 126. An Inhibit A signal, an Inhibit B signal, an Inhibit C signal, an Inhibit D signal, an Inhibit E signal and an Inhibit F signal are each provided to control logic circuit 106. Additionally, control logic 106 is coupled to data processor A 108 to provide the Inhibit A signal and is coupled to data processor B 112 to provide the Inhibit B signal. Additionally, control logic circuit 106 is coupled to data processor C 116 to provide the Inhibit C signal and is coupled to data processor D 120 to provide the Inhibit D signal. On-chip cache 124 is coupled to external cache controller 126. External cache controller 126 provides an external information bus. Control logic circuit 106 is coupled to on-chip cache 124 to provide the Inhibit E signal and is coupled to external cache controller 126 to provide the Inhibit F signal. Additionally, power and ground signals are provided to each of the components of multi-processing system 104 in a manner well-known to those with skill in the art. As such power and ground connections are required by most elements of multi-processing system 104, a visual connection will not be illustrated herein for purposes of clarity of the invention. Thus, a Power A (PA) signal and a Ground A (GA) signal are each provided to data processor A 108 and L1 cache A 110 using well-known routing techniques. Similarly, a Power B (PB) signal and a Ground B (GB) signal are provided to data processor B 112 and L1 cache B 114. A Power C (PC) signal and a Ground C (GC) signal are provided to data processor C 116 and L1 cache C 118, while a Power D (PD) signal and a Ground D (GD) signal are provided to data processor D 120 and L1 cache D 122. As well, a Power E (PE) signal and a Ground E (GE) signal are provided to on-chip cache 124. A Power F (PF) signal and a Ground F (GF) signal are provided to external cache controller 126.

During operation, control logic circuit 106 receives each of the Inhibit A, Inhibit B, Inhibit C, Inhibit D, Inhibit E, and Inhibit F signals from another device on integrated circuit first-level package 102 in response to programmed input from an external user. Additionally, each of the Inhibit A, Inhibit B, Inhibit C, Inhibit D, Inhibit E, and Inhibit F signals may be tied to an appropriate one of a ground and power plane of integrated circuit first-level package 102 as dictated by a design of integrated circuit first-level package 102. Alternatively, the Inhibit A, Inhibit B, Inhibit C, Inhibit D, Inhibit E, and Inhibit F signals may be left unconnected such that they float to a certain logic level as determined by the technology with which multi-processing system 104 is implemented. In an alternate embodiment of the present invention, the Inhibit A, Inhibit B, Inhibit C, Inhibit D, Inhibit E, and Inhibit F signals may have a logic state controlled by control logic circuit 106 to selectively enable each of the these signals to enable or disable a corresponding device on multi-processing system 104.

Furthermore, the power and ground connections to each of the devices implemented on multi-processing system 104 may be selectively tied to an appropriate power or ground plane to enable that processing element to perform properly when the processing element is functional. Alternatively, the power and ground inputs to each of the processing elements may be left floating or tied to an appropriate reference voltage level (power, ground, etc.) to disable the corresponding processing element from functioning correctly within multi-processing system 104.

Assume that in one embodiment of the present invention, either the Inhibit A, Inhibit B, Inhibit C, Inhibit D, Inhibit E, or Inhibit F signal is asserted and provided to control logic circuit 106, such that control logic circuit 106 provides an appropriate disabling signal to a corresponding one of data processor A 108, data processor B 112, data processor C 116, data processor D 120, on-chip cache 124, and external cache controller 126. It should be noted that none, one, or multiple ones of the Inhibit A, Inhibit B, Inhibit C, Inhibit D, Inhibit E, and Inhibit F signals may then be provided to control logic circuit 106 to disable none, one, or multiple ones of data processor A 108, data processor B 112, data processor C 116, data processor D 120, on-chip cache 124, and external cache controller 126. By selectively disabling none, one, or a selected portion of the plurality of data processors 108 through 120, the present invention implements a multi-processing system that allows the manufacturer of multi-processing system 104 to maximize the yield and minimize the overhead costs associated with manufacturing. Thus, the use of a multi-processing system that has partial functionality and a lower performance level is sufficient for some less challenging applications and may provide a method for recovering manufacturing and overhead costs associated with manufacturing large multi-processing system.

Alternatively, assume that in one embodiment of the present invention, either the PA, PB, PC, PD, PE or PF value is either left floating or coupled to a ground reference voltage to effectively disable a corresponding one of data processor A 108, data processor B 112, data processor C 116, data processor D 120, on-chip cache 124, or external cache controller 126. During operation, none, one, or multiple ones of the PA, PB, PC, PD, PE and PF signals may be left floating or coupled to a reference ground voltage to disable one, none, or multiple ones of data processor A 108, data processor B 112, data processor C 116, data processor D 120, on-chip cache 124, and external cache controller 126. As described above, by selectively disabling one, none, or a selected portion of the plurality of data processors 108 through 120, the present invention implements a multi-processing system that allows the manufacturer of the system to maximize yield and minimize the overhead costs associated with manufacturing.

Figure 2:
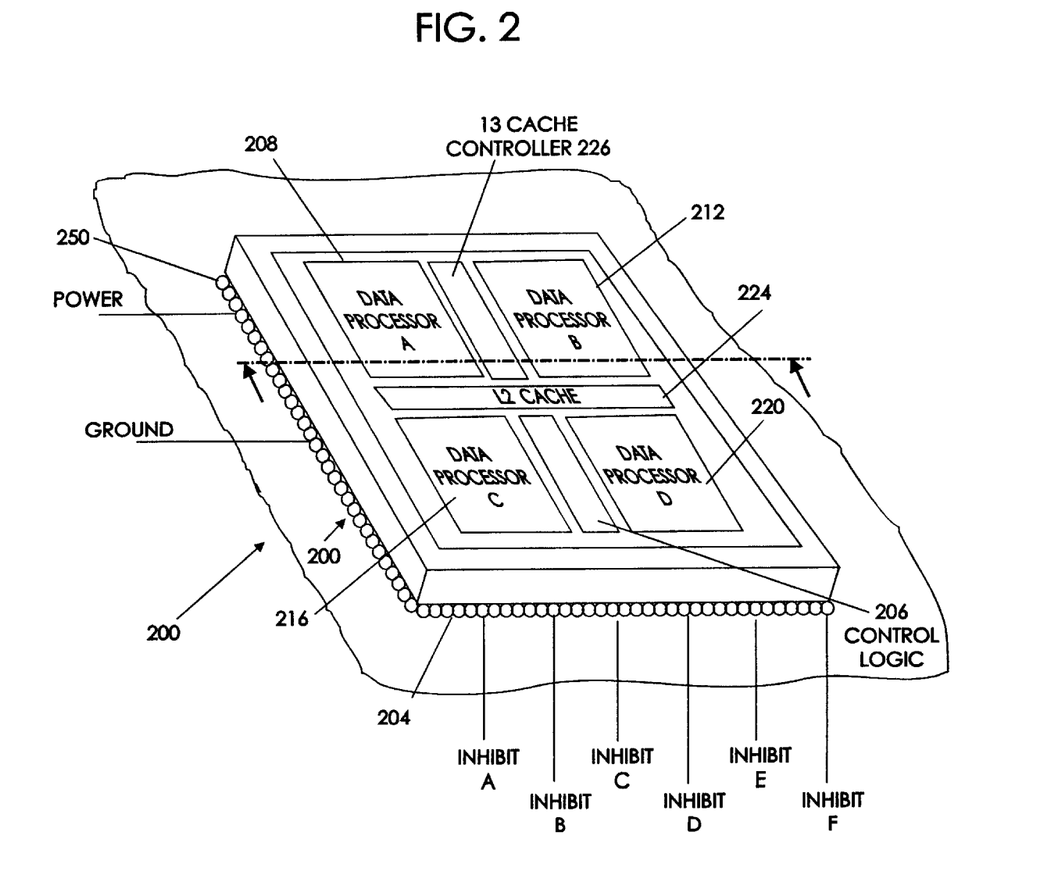
FIG. 2 illustrates, in a perspective view, a portion of an integrated circuit first-level package having one embodiment of a multi-processor system of the present invention coupled thereto.

FIG. 2 illustrates a perspective view of an integrated circuit first-level package 200 that implements a multi-processing system 204 in accordance with one embodiment of the present invention. As illustrated in FIG. 2, multi-processing system 204 is coupled to integrated circuit first-level package 200 via a plurality of solder balls 250. In an alternative embodiment, multi-processing system 204 may be coupled to integrated circuit first-level package 200 via a plurality of solder columns, an array of metal leads, and with any other well-known connection mechanism utilized in the manufacture of integrated circuits.

During operation, each of the signals input to the components of multi-processing system 204 are communicated via an appropriate trace within integrated circuit first-level package 200 to one of the plurality of solder balls 250. Thus, each of the Inhibit A, Inhibit B, Inhibit C, Inhibit D, Inhibit E, and Inhibit F signals is coupled to one of the plurality of solder balls 250. Likewise, power and ground signals are also provided to at least one of the plurality of solder balls 250. It should be noted that integrated circuit first-level package 200 is multi-layered and may include separate power and ground planes, in a manner well-known to those with skill in the relevant art. Furthermore, it should be noted that there may be multiple power and ground boundaries within integrated circuit first-level package 200. Thus, a Power A signal may be provided to data processor A 208, while a Power B signal may be provided to data processor B 212. The Power A and Power B signals may be connected to a same power plane or may be coupled to different power planes within integrated circuit first-level package 200.

As previously mentioned, in one embodiment of the present invention, each of the Inhibit A, Inhibit B, Inhibit C, Inhibit D, Inhibit E, and Inhibit F signals may be selectively asserted and provided to a corresponding one of data processor A 208, data processor B 212, data processor C 216, data processor D 220, on-chip cache 224, or external cache controller 224. Additionally, as an alternative to the use of the Inhibit A, Inhibit B, Inhibit C, Inhibit D, Inhibit E, and Inhibit F signals or in addition to the use of these Inhibit signals, the power and ground planes implemented on integrated circuit first-level package 200 may be segmented during design of integrated circuit first-level package 200 to effectively refrain from providing power to a failing one of data processor A 208, data processor B 212, data processor C 216, data processor D 220, on-chip cache 224, and external cache controller 226. In one embodiment of the present invention, segmentation may occur on the die and not in the package. Additionally, it should be noted that in alternate embodiments of the present invention, both the power and ground planes implemented on first-level integrated circuit package 200 may be tied to a reference ground voltage for certain defect types. In particular, where defects involve power or ground shorts, excessive leakage, or opens, such an alternative may prove to be preferable.

Figure 3:
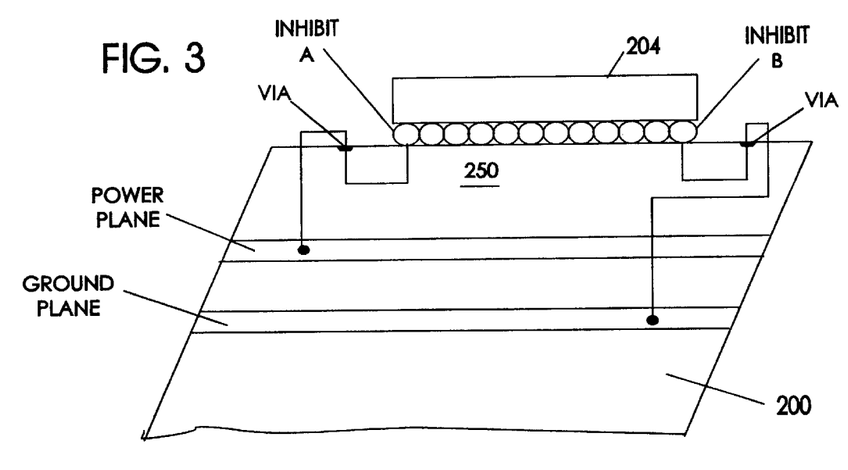
FIG. 3 illustrates, in cross-section form, a multi-processor system implemented in accordance with one embodiment of the present invention.

FIG. 3 illustrates a cross-section view of a portion of integrated circuit first-level package 200. FIG. 3 illustrates one embodiment of the present invention in which the Inhibit signals (Inhibit A and Inhibit B as illustrated herein) are selectively coupled to one of the power plane and ground plane of integrated circuit first-level package 200 using a via. For example, assume that the Inhibit A signal is negated to ensure that data processor A 208 functions and is used within multi-processing system 204. The Inhibit A signal is tied to the power plane through the use of a via to ensure that the data processor A 208 will be logically enabled to be functional. Additionally, assume the data processor B 212 is not functional and should be inhibited from participating in operation of multi-processing system 204. Thus, the Inhibit B input to data processor B 212 is coupled to a ground plane within integrated circuit first-level package 200. It should be noted that the connections between the inhibit signals and the power and ground plane may be made through the use of jumpers or fuses in alternate embodiments of the present inventions.

Additionally, it should be noted that traces on the surface of integrated circuit first-level package 200 may be cut either through mechanical means or through the use of laser excises or ion beams to enable an Inhibit signal, where appropriate. It should be noted that such traces are optional in one embodiment of the present invention. Therefore, assuming that the integrated circuit first-level package configuration illustrated in FIG. 3 is desired to be used by the manufacturer of a multi-processor system 204, a trace connecting the Inhibit A signal from the via to the power plane could be physically disconnected so that the Inhibit signal provided to the solder ball input of multi-processing system 204 floats to a negative logic level in one embodiment of the present invention.

Figure 4:
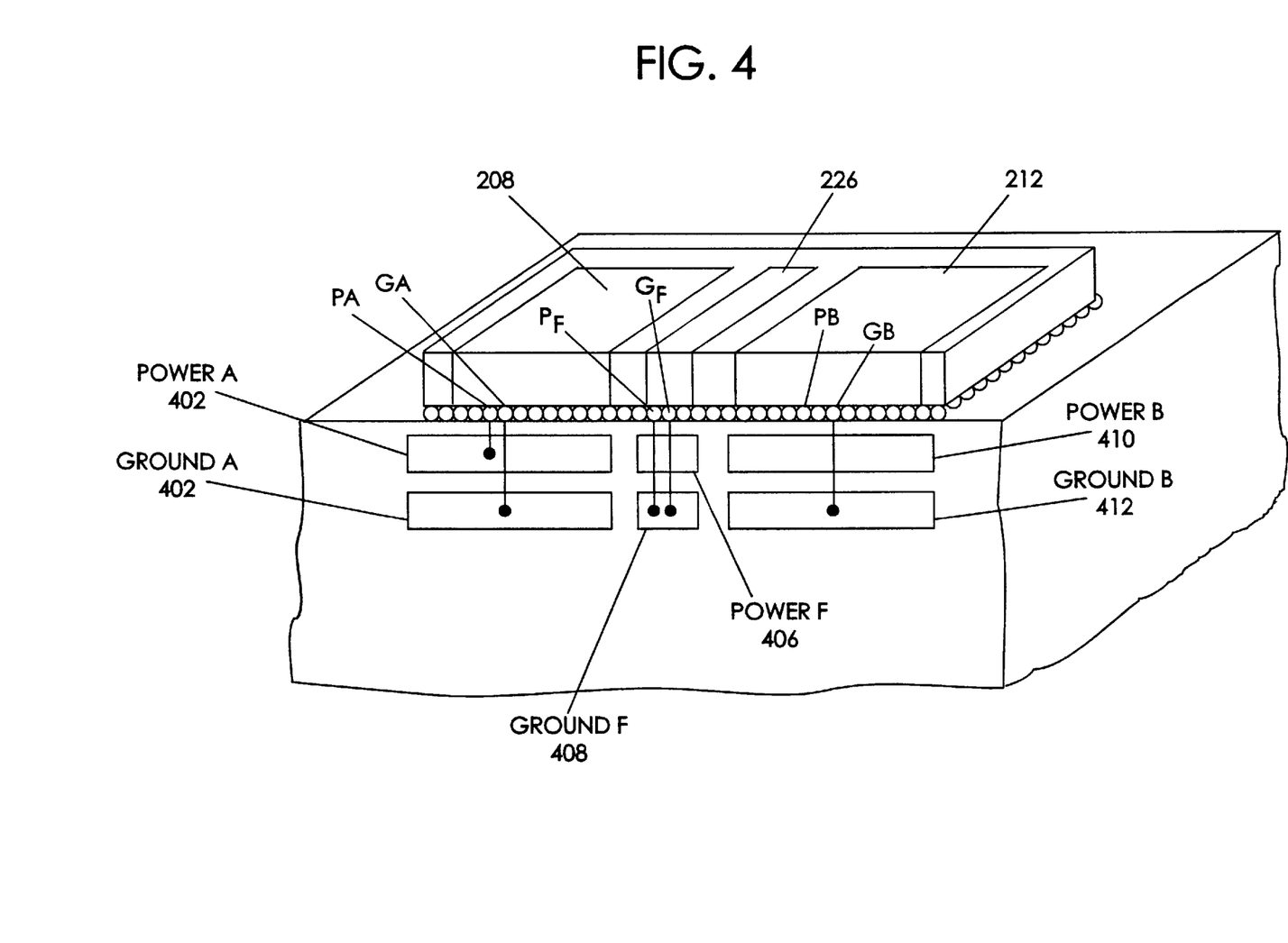
FIG. 4 illustrates, in cross-section form, a multi-processor system implementing in accordance with one embodiment of the present invention.

FIG. 4 illustrates a cross-sectional view of a portion of integrated circuit first-level package 200. FIG. 4 illustrates one embodiment of the present invention in which power and ground supplies to elements implemented on a multi-processing system are selectively coupled to different power and ground planes to enable the associated processing elements to function properly. For example, data processor A 208 receives power and ground signals, respectively labeled PA and GA, to enable data processor A 208 to function correctly. As illustrated in FIG. 4, the PA signal is coupled to a first power plane, Power A 402. Similarly, the GA signal is coupled to a Ground A plane 404. It should be noted that Power A plane 402 and Ground A plane 404 may be segmented and only provide power and ground voltages for data processor A 208.

Alternatively, should one of the processing elements implemented on an integrated circuit first-level package be faulty, a manufacturer of the substrate may choose to tie a power connection for the failing processor to a ground plane to effectively disable the processing element. As illustrated in FIG. 4, external cache controller 226 comprises a Power F (PF) connection. Furthermore, assume that external cache controller 226 is failing. Therefore, the Power F input thereto is coupled to Ground F plane 408. Thus, the power connection is tied to a ground reference voltage and may not be utilized to "power up" external cache controller 226. If external cache controller 226 had been functional, the PF connection thereto would have been coupled to Power F plane 406.

Alternatively, a manufacturer of multi-processing system 200 may choose to leave the power connections for failing processing elements floating. This implementation is illustrated in the connection provided for data processor B 212. As illustrated therein, a power connection, PB, is left unconnected, while a ground connection, GB, is connected to Ground B plane 412. It should be noted that power may be provided to each of data processor A 208, external cache controller 226, and data processor B 212 via a same power plane or via a segmented power plane, such as that illustrated in FIG. 4. Similarly, a ground reference voltage may be provided via a same plane or via a segmented ground plane as is illustrated in FIG. 4.

Figure 5:
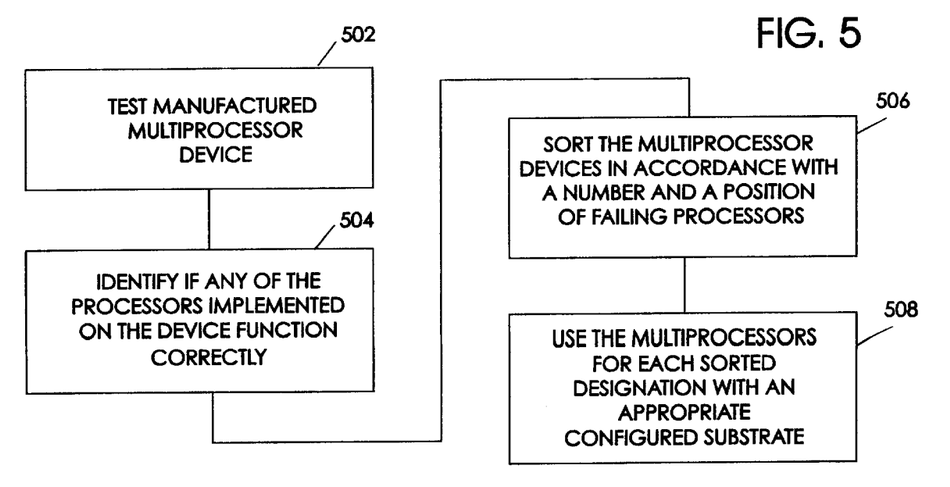
FIG. 5 illustrates, in flow diagram form, a methodology used to implement one embodiment of the present invention.

FIG. 5 illustrates a methodology that may be utilized in one embodiment of the present invention to ensure the effective and correct use of a multi-processing system in an efficient and cost-effective manner. In a first step 502 of FIG. 5, the multi-processing silicon device will be tested while still in a wafer form. Such wafer level testing is well-known to those with skill in the data processing art and, therefore, will not be described in greater detail herein.

Through the use of wafer level testing, the functionality of the processors implemented on the silicon device is tested. Subsequently, this functionality is identified and used to classify the manufactured semiconductor devices into categories. Such categories may include an all-good chip design that indicates that all processors manufactured on the multi-processing device are functional. Additionally, such categories may include three-processor functionality, two-processor functionality, and one-processor functionality in one embodiment of the present invention. Categories may also include L2 cache functionality and L3 cache controller functionality in one embodiment of the present invention. This step of sorting corresponds to step 506 of FIG. 5.

Integrated circuit first-level packages are designed to correspond to each of the possible configurations of processors within the multi-processing system. Thus, one integrated circuit first-level package may be configured to negate the Inhibit A and Inhibit C signals when functional tests indicate that data processor A and data processor C do not function correctly. Alternatively, one integrated circuit first-level package may be configured to tie the Inhibit A and Inhibit C signals to a certain reference voltage, whether ground or $V_{DD}$, when functional tests indicate that data processor A and data processor C do not function correctly. Through the use of such a configuration of an integrated circuit first-level package, a multi-processing device having two functional cores may be sold for use in applications having less complexity and fewer requirements than would be expected from fully functional devices.

Thus, the preset invention provides a unique methodology and design for implementing a multi-processor system in a manner that optimizes the overhead costs associated with manufacturing large integrated circuits having multiple data processors and processing elements thereon. The present invention implements a single silicon integrated circuit that has multiple processor cores on them and provides a method for effectively disabling processing elements that are not functional when those elements are not functional. Such disabling may be through segmentation of power distribution on an integrated circuit first-level package or through the provision of inhibit signals in preselected logic states based on the functionality of the multi-processing system, as determined during an initial testing procedure, including wafer-level testing.

It should be noted that the description provided herein is but one example of an implementation of the present invention. It should be noted that many additional implementations may also be utilized to realize the present invention. For example, the Inhibit signal could be used to facilitate wafer testing by selectively enabling and disabling multiple processors on an integrated circuit first-level package.

While there have been described herein the principles of the invention, it is to be clearly understood to those skilled in the art that this description is made by way of example only and not as a limitation to the scope of the invention. Accordingly, it is intended, by the appended claims, to cover all modifications of the invention which fall within the true spirit and scope of the invention.

What is claimed is:

1. A first-level integrated circuit package, comprising:
   a first processing element;
   a second processing element, wherein the first processing element is capable of performing a first data processing function and the second processing element is capable of performing a second data processing function and, wherein the first data processing function and the second data processing function are performed in parallel;
   a first plurality of embedded control lines for selectively inhibiting the first processing element from performing the first data processing function; and
   a second plurality of embedded control lines for selectively inhibiting the second processing element from performing the second data processing function.

2. The first-level integrated circuit package of claim 1, wherein the first plurality of embedded control lines inhibit the first processing element from performing the first data processing function when the first processing element fails to function correctly.

3. The first-level integrated circuit package of claim 2, wherein the second processing element performs the second data processing function when the first processing element is inhibited from performing the first data processing function.

4. The first-level integrated circuit package of claim 1, wherein the second plurality of embedded control lines inhibit the second processing element from performing the second data processing function when the second processing element fails to function correctly.

5. The first-level integrated circuit package of claim 4, wherein the first processing element performs the first data processing function when the second processing element is inhibited from performing the second data processing function.

6. The first-level integrated circuit package of claim 1, wherein the first plurality of embedded control lines selectively couple the first processing element to a power supply.

7. The first-level integrated circuit package of claim 6, wherein a second plurality of embedded control lines selectively couple a power input of the first processing element to a ground reference voltage.

8. A method for manufacturing a data processing system comprising a plurality of processing elements implemented on a single integrated circuit and a first-level integrated circuit package, comprising the steps of:
   testing a first processing element and a second processing element of the data processing system to identify when at least one of the first processing element and the second processing element fails to function according to a specification;
   selectively inhibiting operation of the first processing element using a first embedded control line embedded within the first-level integrated circuit package when the first processing element fails to function according to the specification;
   selectively inhibiting operation of the second processing element using a second embedded control line embedded within the first-level integrated circuit package when the second processing element fails to function according to the specification; and
   selectively enabling operation of the first processing element and the second processing element when the first processing element and the second processing element function according to the specification, wherein the first processing element and the second processing element execute data processing applications in parallel.

9. The method of claim 8, further comprising the step of:
   coupling the first embedded control line between an inhibit input of the first processing element and a first reference voltage to inhibit operation of the first processing element.

10. The method of claim 8, further comprising the step of:
    coupling the second embedded control line between an inhibit input of the second processing element and a first reference voltage to inhibit operation of the first processing element.

11. The method of claim 8, further comprising the step of:
    coupling the inhibit input of the first processing element to a first reference ground voltage when the first processing element fails to function according to the specification.

12. The method of claim 8, wherein the inhibit input of the first processing element is allowed to float when the first processing element fails to function according to the specification.

13. The method of claim 12, further comprising the step of:
    coupling the inhibit input of the second processing element and a second reference ground voltage when the second processing element fails to function according to the specification, wherein the first reference ground voltage and the second reference ground voltage are implemented in separate planes of the first-level integrated circuit package.

14. A data processing system, comprising:
    an integrated circuit, comprising:
       a first processing element; and
       a second processing element, wherein the first processing element is capable of performing a first data processing function and the second processing element is capable of performing a second data processing function and, wherein the first data processing function and the second data processing function are performed in parallel; and
    an integrated circuit package, comprising:
       a first plurality of embedded control lines for selectively inhibiting the first processing element from performing the first data processing function; and
       a second plurality of embedded control lines for selectively inhibiting the second processing element from performing the second data processing function.

15. The data processing system of claim 14, wherein the first plurality of embedded control lines selectively enable the first processing element to perform the first data processing function and the second plurality of embedded control lines selectively enable the second processing element to perform the second data processing function.

16. The data processing system of claim 14, wherein the first plurality of embedded control lines inhibit the first processing element from performing the first data processing function when the first processing element fails to function according to a specification.

17. The data processing system of claim 16, wherein the second processing element performs the second data processing function when the first processing element is inhibited from performing the first data processing function.

18. The data processing system of claim 14, wherein the second plurality of embedded control lines inhibit the second processing element from performing the second data processing function when the second processing element fails to function correctly.

19. The data processing system of claim 18, wherein the first processing element performs the first data processing function when the second processing element is inhibited from performing the second data processing function.

20. The data processing system of claim 14, wherein the first plurality of embedded control lines selectively couple the first processing element to a power supply.

21. The data processing system of claim 20, wherein the first plurality of embedded control lines selectively couple a power input of the first processing element to a ground reference voltage.

* * * * *